United States Patent [19]
Henno et al.

[11] Patent Number: 6,035,421
[45] Date of Patent: Mar. 7, 2000

[54] SYSTEM FOR TESTING A COMPUTER BUILT INTO A CONTROL DEVICE

[75] Inventors: Christiane Henno, Tübingen; Werner Harter, Illingen, both of Germany

[73] Assignee: Robert Bosch GmbH, Stuttgart, Germany

[21] Appl. No.: 08/952,763

[22] PCT Filed: Nov. 29, 1996

[86] PCT No.: PCT/DE96/02289

§ 371 Date: Nov. 18, 1997

§ 102(e) Date: Nov. 18, 1997

[87] PCT Pub. No.: WO97/36232

PCT Pub. Date: Oct. 2, 1997

[30] Foreign Application Priority Data

Mar. 23, 1996 [DE] Germany .................. 196 11 520

[51] Int. Cl.[7] ...................................... G06F 11/24
[52] U.S. Cl. .................. 714/30; 714/24; 714/25; 714/32; 714/27; 714/724; 714/725
[58] Field of Search .................. 714/24, 37, 725, 714/724, 25, 27, 30, 32

[56] References Cited

U.S. PATENT DOCUMENTS

| | | | |
|---|---|---|---|
| 4,399,538 | 8/1983 | Cholakian et al. | 714/22 |
| 4,726,024 | 2/1988 | Guziak et al. | 714/24 |
| 4,922,184 | 5/1990 | Rosenstein et al. | 324/72.5 |
| 5,212,410 | 5/1993 | Sase . | |
| 5,488,320 | 1/1996 | Carvella et al. | 327/65 |
| 5,592,077 | 1/1997 | Runas et al. | 714/732 |
| 5,621,742 | 4/1997 | Yoshino | 714/745 |

FOREIGN PATENT DOCUMENTS

| | | |
|---|---|---|
| 0 481 487 | 4/1992 | European Pat. Off. . |
| 0 699 998 | 3/1996 | European Pat. Off. . |

OTHER PUBLICATIONS

"Parallel means fast", Market and Technology, Weekly journal of Electronics, No. 36, Sep. 1, 1995, p. 58*.

*Primary Examiner*—Robert W. Beausoliel, Jr.
*Assistant Examiner*—Wasseem H. Hamdan
*Attorney, Agent, or Firm*—Kenyon & Kenyon

[57] ABSTRACT

A system for testing a computer built into a control unit. A power supply unit is provided for the voltage supply for the control unit and the computer. In addition, the test result can be indicated by a device and/or means may be provided for shutting down the system regulated and/or controlled by the control unit. The control unit contains means that can bring the computer into certain operating modes. In addition, sensing means are provided that detect the current or voltage in the power supply circuit of the computer, whereupon the current or voltage detected is compared with at least one preset threshold value in comparator means. For actuation of the device and/or the cutoff, there are actuator means that indicate an error depending on the result of the comparison or cause all or part of the system to be shut down in reaction to such an error.

19 Claims, 6 Drawing Sheets

SYSTEM FOR TESTING A COMPUTER BUILT INTO A CONTROL DEVICE

FIELD OF THE INVENTION

The present invention relates to a system for testing a computer installed in a controller.

BACKGROUND OF THE INVENTION

Processor errors in controllers that control or regulate functions that are critical with regard to safety must be detected by monitoring. The controllers with safety functions are conventionally used for anti-lock control systems, traction control systems and/or driving dynamics control systems. Self-test, plausibility monitoring and watchdog methods are known for use in single-computer controllers.

Methods and measuring equipment for measuring the quiescent current (IDDQ) are used for manufacturer testing of CMOS components (integrated circuits, IC). The testing is described, for example, in the article "Parallel heiBt schnell", (Parallel means fast) *Markt und Technik, Wochenzeitung für Elektronik* (Market and Technology, Weekly Journal of Electronics), no. 36 of Sep. 1, 1995, page 58. The background of the quiescent current test is that in a digital CMOS component in a purely static logic, almost the entire power loss occurs in its interior during switching operations. In an idle state, the current flow is limited to tiny leakage currents and currents due to pull-up or pull-down resistance at the inputs and external loads at the output drivers. Many manufacturing-related errors lead to increased conductivity between the positive and negative power supply voltage. If such defective regions (point errors) in a circuit are activated, it leads to a sudden increase in current consumption. Such errors can be detected by a highly precise measurement of current consumption during the test procedure and comparison with suitable setpoints. Such a quiescent current measurement is utilized in the production of CMOS components to sort out the defective components after the manufacturing process.

Utilizing the above described controllers with safety functions, it is customary to provide two computers that check on each other mutually by parallel computing and/or plausibility tests to increase reliability. Cost considerations suggest using only one computer in these controllers.

The object of the present invention is to increase the reliability in operation with a control unit having safety functions.

SUMMARY OF THE INVENTION

The present invention provides a system for testing a computer installed in a controller. A power supply unit is provides supply power to the control unit and to the computer. In addition, the test results may be displayed and/or means may be provided for shutting down the system controlled and/or regulated by the controller. The control unit contains means that can bring the computer into certain operating modes. In addition, sensing means are provided to detect the current or voltage in the computer's power supply circuit, whereupon the current or voltage detected is compared in comparing elements with at least one preset threshold value. To activate the display and/or the cut-off, there are actuators that cause an error to be displayed, if applicable, depending on the result of the comparison, or cause all or part of the system to be shut down in reaction to such an error.

The system according to the present invention has the advantage that a multitude of possible errors in a computer can be detected by a simple measurement of current or voltage. The quiescent current measurement known in the production of computer components is used during normal operation of a computer built into a controller. The system according to the present invention can detect the most common errors in the computer module with a few test steps. Such errors include lock-up errors (stuck at), bridge errors (bridging) and/or interrupt errors (stuck open).

In particular, the combination of the quiescent current measurement according to the present invention with an optimized self-test program yields an error coverage that is adequate for safety-critical applications with regard to the most important errors in computer modules, in particular CMOS processors. The advantage of the above-mentioned elimination of the second processor is largely preserved with the system according to the present invention, because the quiescent current measurement according to the present invention requires very little hardware.

In an advantageous embodiment of the present invention, the means for converting the computer to certain operating modes is designed so that predetermined computer parts are brought into a low current state by a special control of the computer. The components having a relatively high current are mostly provided in the computer. The quiescent current measurement is generally based on fluctuations in the quiescent current within relatively narrow bandwidths, thus computer components with a high current interfere with the test according to the present invention. In particular, the computer parts that do not concern the test according to the present invention are brought into the low current state. Such computer parts may be the computer output stage and/or an input stage (e.g., analog-to-digital converter) and circuits for internal clock fan-out. These computer parts with a high current are shut down during the test. Thus, internal circuit parts and outputs carrying high currents are shut down, so that all internal nodes are in a defined state. Then the measurement of the quiescent current can be performed.

Through the shut-down of computer parts with a high current, the computer core can be brought into a low current state. With such computer modules designed specifically for quiescent current measurement, a special Integrated Circuit Quiescent Current ("IDDQ") test mode is provided. In the operating mode, all currents inside the computer are interrupted, i.e., the current in the computer core is minimized. The computer core is designed so that little or no static current can flow between the power supply and ground when the computer core operates properly. The IDDQ design is such that standard errors in the computer core are manifested in an increase in quiescent current. For example, short-circuit errors or stuck-at errors (short-circuit to ground or the power supply) are manifested in an immediate increase in quiescent current. It is not necessary here for the effect of such an error to be propagated to the outputs of the computer. The increased current consumption is the immediate error indicator.

In addition to the IDDQ test method described above, it is also possible to provide for only the computer parts with a high current to be shut down and for the computer to go into a defined low current state in response to a command. The computer core need not be designed specifically for the IDDQ test mode. Such mode is referred to as the power-down mode.

Another advantageous embodiment of the present invention is provides a clock is provided in the control unit in a known way. In particular, internal processes within the computer are controlled according to the output signals of the clock. Using the IDDQ test mode the clock is interrupted or switched off or disconnected from the computer. This can be accomplished in the power-down mode, if an especially low quiescent current is to be achieved. This interruption or shut-down or disconnection of the clock takes place at the start of each quiescent current measurement in particular.

The power-down mode is initiated by loading internal components of the computer such as registers and memories with certain patterns and bringing the above-mentioned computer parts into the low current state, e.g., by executing a certain computer command. Once this condition has been reached, the clock can be turned off or disconnected. Then the quiescent current or a corresponding voltage value is measured and compared with a threshold value that corresponds to the operating status (power-down mode) of the computer core established as described above. If certain errors are already present in the computer (stuck-at, bridging or stuck-open errors), the error usually leads to an increase in quiescent current or the voltage drop caused by the quiescent current.

Such a test step may be followed by additional test steps by first leaving the power-down mode by applying certain signal levels to certain computer terminals. Internal parts of the computer, such as registers and memories, are then loaded with additional patterns by restarting or turning on the clock, and the above-mentioned computer parts are again brought into the low-current status, e.g., by executing a certain computer command (power-down command). This is again followed by the quiescent current measurement described above.

Performing a plurality of such measurements of the power-down current in succession permits increasingly complete detection of errors in registers, memories and parts of the computer core.

The individual test steps are ended by renewed release of the clock, depending on the type of computer and the circuit design. After the last test step, the computer is operated in its normal operating mode again (normal mode).

In addition to the quiescent current measurement in the power-down mode described above, a measurement of the quiescent current in the above-mentioned IDDQ test mode is provided according to the present invention, if the computer to be tested is designed for this. The start of the IDDQ test mode is initiated, for example, by a change in signal level at a computer terminal. Here again, before starting the IDDQ test mode, registers and memories are loaded with certain patterns. When the IDDQ test mode begins, the computer parts with a high current are shut down. In addition, the computer core can be kept in a state typical of this state by stopping or uncoupling the clock during execution of a command. These commands are selected so that they set the states of the internal circuit nodes of the computer core so that the greatest possible number of errors can be detected by the quiescent current measurement.

Using a plurality of successively performed measurements of the quiescent current, an increasingly complete detection of errors in registers, memories, and the entire computer core is obtained, i.e., an error analysis in the different operating modes of the computer core. Thus, it is not necessary for the quiescent current measurements in the control unit to be performed in real time, i.e., with the clock running, but instead they are always performed in the pauses, when the clock is stopped. Such variant of the present invention minimizes the resources related to the speed of analysis of the quiescent current. In addition, a quiescent current measurement can also be performed to the present invention while the clock is running if the measurement equipment operates fast enough, the computer is designed for such a rapid change between IDDQ test mode and normal operation, and no circuit parts in the computer have to be shut down.

The quiescent current measurement according to the present invention can be performed either directly using a known method for measuring current with the computer, or the voltage drop at a measuring resistor can also be detected in a known way. Furthermore, the quiescent current measurement can take place in the power supply circuit, i.e., in the voltage supply lead of the computer, in the ground path of the computer and/or in the voltage regulator.

In particular, the system according to the preesent invention relates to the testing of processors that are implemented in CMOS technology.

DETAILED DESCRIPTION OF THE DRAWINGS

Figure 1:
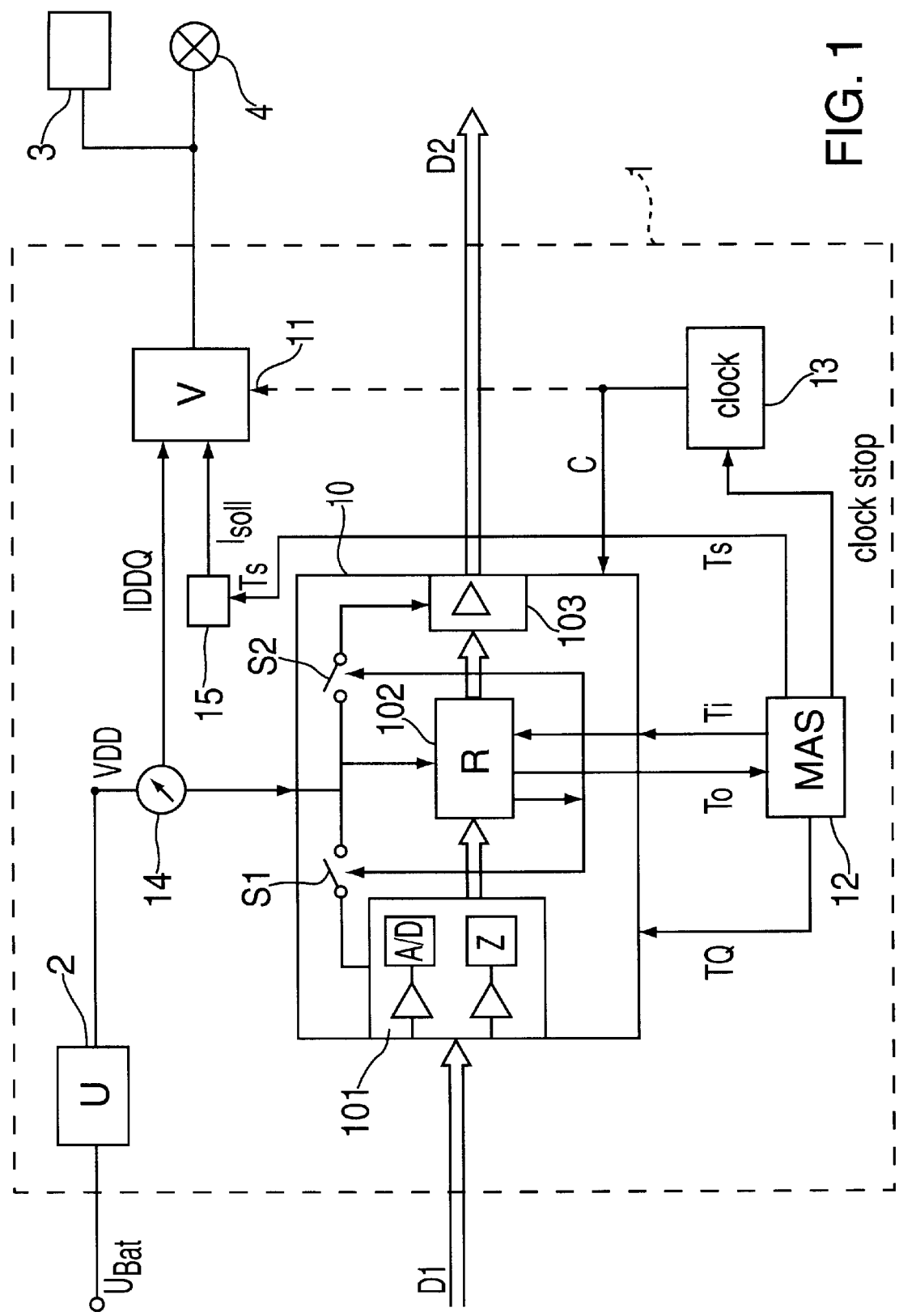
FIG. 1 shows a schematic diagram according to the present invention.

The schematic diagram in FIG. 1 shows a control unit 1. Over data line D1, control unit 1 receives input data, such as sensor output signals, to form, as a function of the input signals over output D2, output signals that are relayed to corresponding actuators. For example, when control unit 1 is a controller for an anti-lock system, the rotational speeds of the vehicle wheels are sent as input signals to input D1. Depending on these input signals, control signals for lowering the brake pressure, increasing the brake pressure or maintaining a constant brake pressure are available at the output of controller 1 (output D2). For this purpose, solenoid valves are activated as actuators. The power supply voltage VDD is sent to controller 1 via voltage regulator 2. The input of voltage regulator 2 is at battery voltage potential $U_{Bat}$. The current in the supply voltage circuit is measured by current meter 14 and sent to comparator unit 11. The current value detected is compared with a setpoint $I_{Soll}$ in comparator unit 11, whereupon a signal lamp 4 is triggered according to the result of the comparison. At the same time or as an alternative, the system regulated or controlled by controller 1 is shut down by interrupting device 3.

Internal processes within the controller are controlled by clock 13 (clock signal C). Computer 10 inside the control unit has an input stage 101, generally an analog-to-digital converter, a computer core 102 and an output stage 103. To determine the output signals (output D2) as a function of the input signals (input D1), input circuit 101 converts the input signals, which are analog signals or square-wave signals, to digital values. In addition to input amplifiers, input circuit 101 may have an analog-to-digital converter unit and counter and timer circuits. In computer core 102, these digital numerical values are linked together and, amplified by output stage 103, delivered to output D2.

The internal processes of the computer can be influenced using control signals Ti through the measurement sequence control system MAS 12. Measurement sequence control system 12 receives a status signal T1, in particular from computer core 102, through signal To. In addition, clock 13 can be started or stopped by measurement sequence control system 12.

In this embodiment, normal operation outside the test according to the preent invention will not be described further, because this normal operation is known from the related art in a wide variety of ways. Thus, it should be pointed out here the system according to the present invention is not limited to use with an anti-lock system, a traction control system, or a driving dynamics control system. essence consist of determining when the test system according to the present invention begins with the test according to the present invention. There are also a wide variety of procedures in the related art in this regard. In general, with the automotive control systems, a test is performed at low vehicle forward speeds after a restart. In addition, such tests can also be initialized at certain low vehicle speeds and at certain intervals during normal operation.

Power-down mode:

The power-down mode begins with the computer writing certain patterns into its registers and read-write memory in the first step of the test; then the measurement sequence control system MAS 12 is notified by control signal To that a power-down measurement is to be performed. Then MAS 12 confirms this request with signal Ti, whereupon computer 102 disconnects input circuit 101 from the power supply by executing the power-down command and disconnecting output stage 103 from the power supply by opening switches S1 and S2. Input circuit 101 and output stage 103 are components of computer 10 that have a relatively high current. In general, disconnecting these computer parts lowers the current flowing through computer 10 drastically. After disconnecting the input and output stages, the quiescent current is measured in the power-down mode using the current meter 14. In comparator unit 11, the measured instantaneous quiescent current is compared with a corresponding setpoint $I_{Soll}$ which can be stored in memory 15, for example, as a voltage value. If the quiescent current or the corresponding voltage exceeds the reference value $I_{Soll}$, which indicates an error in computer core 102, whereupon warning lamp 4 is switched on and/or the entire system or subsystems are shut down by interrupting device 3.

Clock 13 may optionally be stopped prior to the quiescent current measurement.

IDDQ test mode:

The IDDQ test mode begins with the computer writing certain patterns into its registers and read-write memories in the first step of the test, and then notifying the measurement sequence control system MAS 12 by control signal To that an IDDQ measurement is to be performed. Then MAS 12 confirms this request with signal Ti, whereupon computer 102 executes a selected command setting the states of the internal circuit nodes of the computer core so that as many errors as possible can be detected by the quiescent current measurement. During the execution of this command, MAS 12 brings the computer into the IDDQ test mode by changing signal TQ and the clock 13 is stopped using the clock stop signal. By starting the IDDQ test mode, input circuit 101 and output stage 103 in the computer are disconnected from the power supply by opening switches S1 and S2.

Using current meter 14, the quiescent current is measured in the IDDQ test mode. The instantaneous quiescent current measured is compared in comparator unit 11 with a corresponding setpoint $I_{Soll}$, which can be stored as the voltage value in memory 15, for example. If the quiescent current or the respective voltage exceeds the reference value $I_{Soll}$, this is indicative of an error in computer core 102, whereupon warning lamp 4 is turned on and/or all or part of the system is disconnected by interrupting device 3.

By canceling signal TQ and releasing clock 13 again, the computer is returned to normal mode and can prepare for the next test step by loading the next test patterns in the registers and memories. Then the transition to the IDDQ test mode follows again, while the computer is executing another selected command.

In the IDDQ test mode, it is also possible for different reference values to be provided for the quiescent current or the corresponding voltage drop for different test steps, said reference values being selected by measurement sequence control system 12 via control signal Ts.

Figure 2:
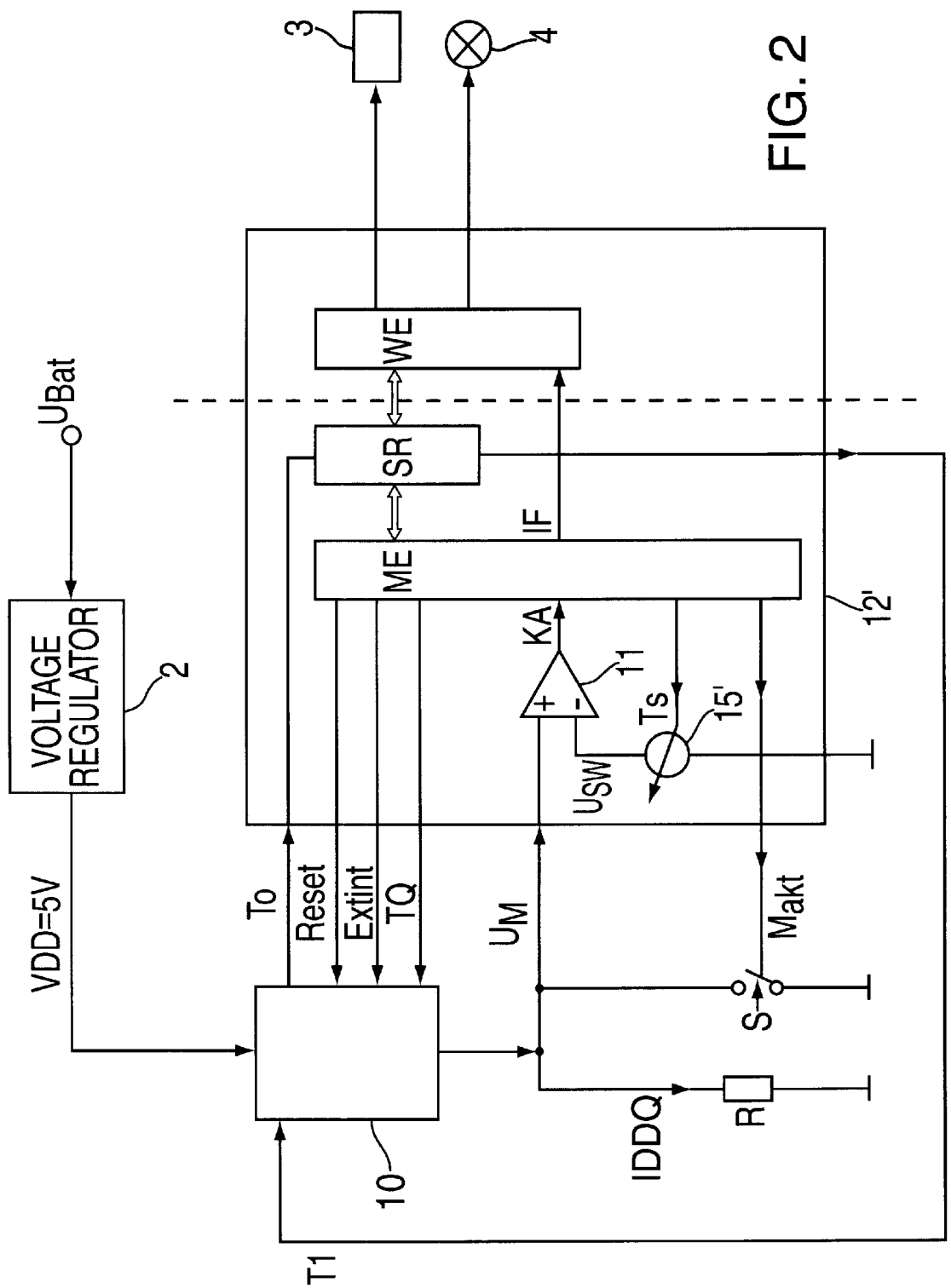
FIG. 2 shows an exemplary detailed embodiment according to the present invention.

Quiescent current measurement in the ground path:

FIG. 2 shows a variant of the present invention where the quiescent current measurement in the ground path is actuated. The test according to the present invention is controlled by a measurement sequence control system MAS 12', where this measurement sequence control system may optionally be integrated with a watchdog circuit, known per se, in an integrated circuit IC. After switching on the power supply voltage VDD (output signal of voltage regulator 2), the processor or computer 10 is initialized for the first quiescent current measurement (e.g., RAM and register contents= 00H). Over a serial interface, processor 10 sends measurement sequence control system 12' a test number (signal T0) which indicates that a quiescent current is to be performed. Optionally, in the embodiment shown in FIG. 2, means may also be provided for relaying the expected value of the quiescent current to the measurement sequence control system by means of signal T0 in this test.

Such data is transferred to shift register SR and from there to receive register ME of the measurement sequence control system or watchdog WE. This is accomplished via the data clock line and CS line from the processor to the measurement sequence control system (not shown in FIG. 2).

As mentioned previously, the processor assumes a certain low current operating mode in the IDDQ test mode. With processors that are not designed specifically for quiescent current measurements, only the final stage and the output stage are usually disconnected (power-down mode). After the processor has begun this power-down mode, the measurement sequence control system 12' opens switch S (semiconductor switch) with the "measurement is active" signal $M_{akt}$ and initiates the measurement operation.

In the measurement operation, the voltage drop $U_M$ across resistor R representing the quiescent current is measured and compared with a reference voltage $U_{SW}$. If the quiescent current thus measured exceeds the fixed threshold, output KA of comparator 11 is switched from a low state to a high state, whereupon the measurement sequence control system detects an error and switches the system off with signal IF, which goes to the watchdog in this embodiment (disconnecting device 3), and switches on warning lamp 4.

If the measured quiescent current (or the respective voltage $U_M$) is less than threshold $U_{SW}$, switch S is closed again, and the processor is taken out of the power-down mode with the reset or extint signals, which means that the input and output stages are turned on again in this embodiment according to the present invention.

If a plurality of test steps according to the present invention are provided in the power-down mode as in this embodiment, then processor 10 initializes for the next quiescent current test and delivers the next test number to the measurement sequence control system. Depending on the test number read back over the "status signal" connection T1, the processor can learn the status of the test number. After a fixed number of tests, the processor goes into normal mode and transmits instead of signals T0 a cycle signal which is monitored in a known way by the known watchdog circuit. The number of tests is either set in the hardware of measurement sequence control system 12' or is transmitted to the measurement sequence control system after the processor is switched on.

In the power-down mode described above, only register and memory contents can be initialized with patterns, but not different nodes of the internal circuit.

However, the procedure can be extended to the IDDQ test mode in the manner described above. For this purpose, the computer core is brought into certain operating modes by the above-mentioned execution of selected commands and the quiescent current is measured for these operating modes. Furthermore, the clock must be stopped in the IDDQ mode, as described above.

As mentioned previously, reference voltage $U_{SW}$ can be set at different levels by signal Ts, if different quiescent currents are to be expected in the tests. Temperature compensation can be performed, as needed, using the reference voltage setting, because the quiescent current increases with temperature.

Figure 3:
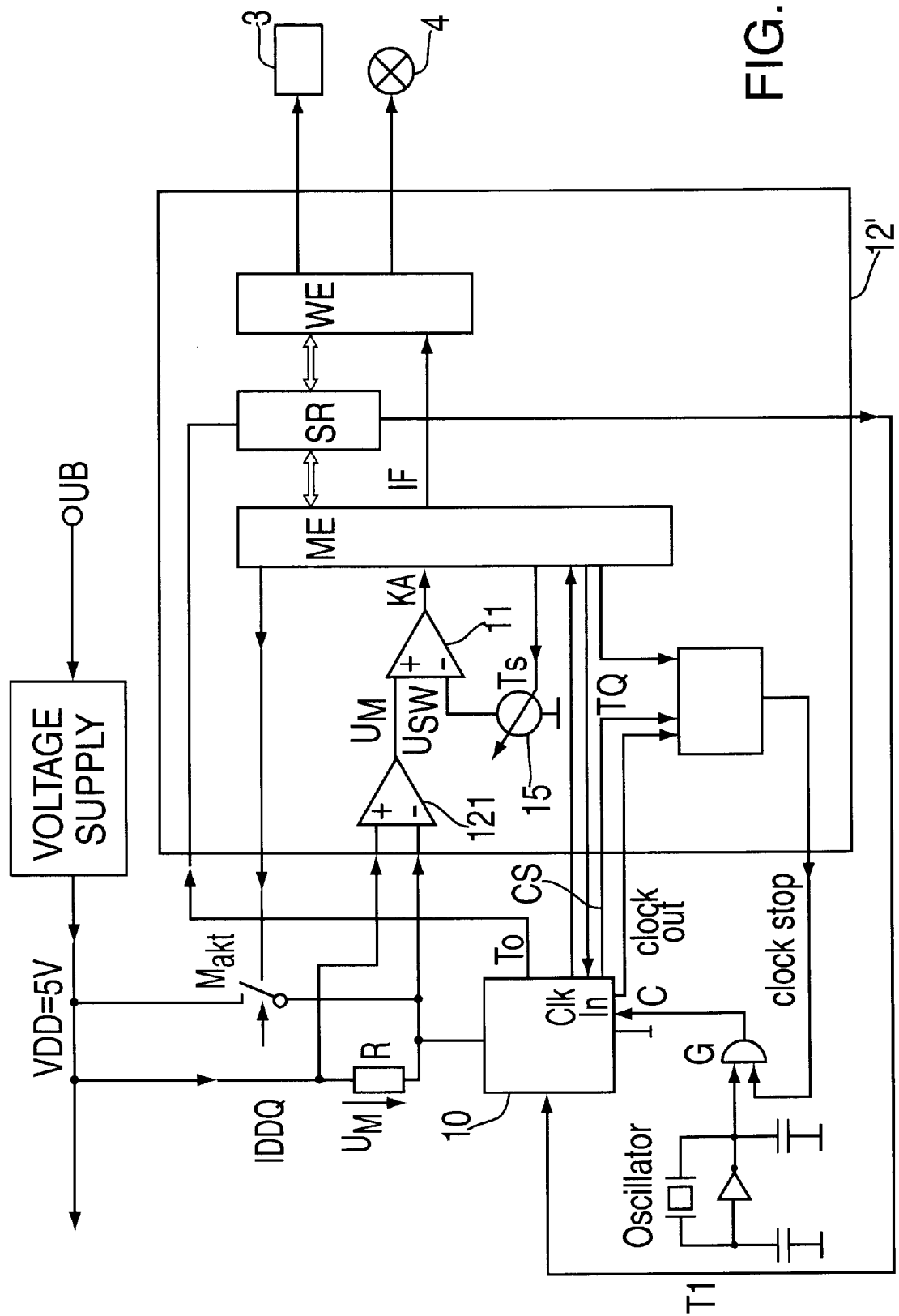
FIG. 3 shows another exemplary embodiment according to the present invention.

Quiescent current measurement in the power supply Path:

FIG. 3 shows another embodiment of the present invention where the quiescent current measurement is performed in the power supply path. At the same time, the stopping of the clock is illustrated using this embodiment. Blocks of the same function here are labeled with the same notation from FIG. 2 and will not be described again.

First the processor is initialized. The initialization includes a reset phase and a defined sequence of selected functions (commands) that are selected with the help of error simulation, for example. When the first test pattern is reached, the processor signals this by sending the measurement sequence control system MAS the signal To. Then the MAS switches the processor to the IDDQ test mode using signal TQ and interrupts the clock on the processor at a defined time via the clock stop signal. Stopping of the processor clock takes place as defined by linking the clock stop signal with the CS signal and the computer's clock out signal.

The precise time for stopping the processor clock can be set by an additional counter circuit, which is easy to implement by integrating a quartz oscillator into the measurement sequence control system.

The IDDQ test mode ensures that no internal nodes of the processor are at an indefinite potential ("floating") and that all internal current-carrying paths have been disconnected. All internal buses are in a defined state and all pull-up and pull-down resistances have been switched off. All necessary measures for the quiescent current measurement must have been taken already by the setting the developed according to IDDQ design rules into the IDDQ test mode.

When the processor clock is stopped, it is advantageous that in addition to the register and memory contents, other circuit nodes in the processor can also be set to specific patterns by executing certain commands.

Figure 4:
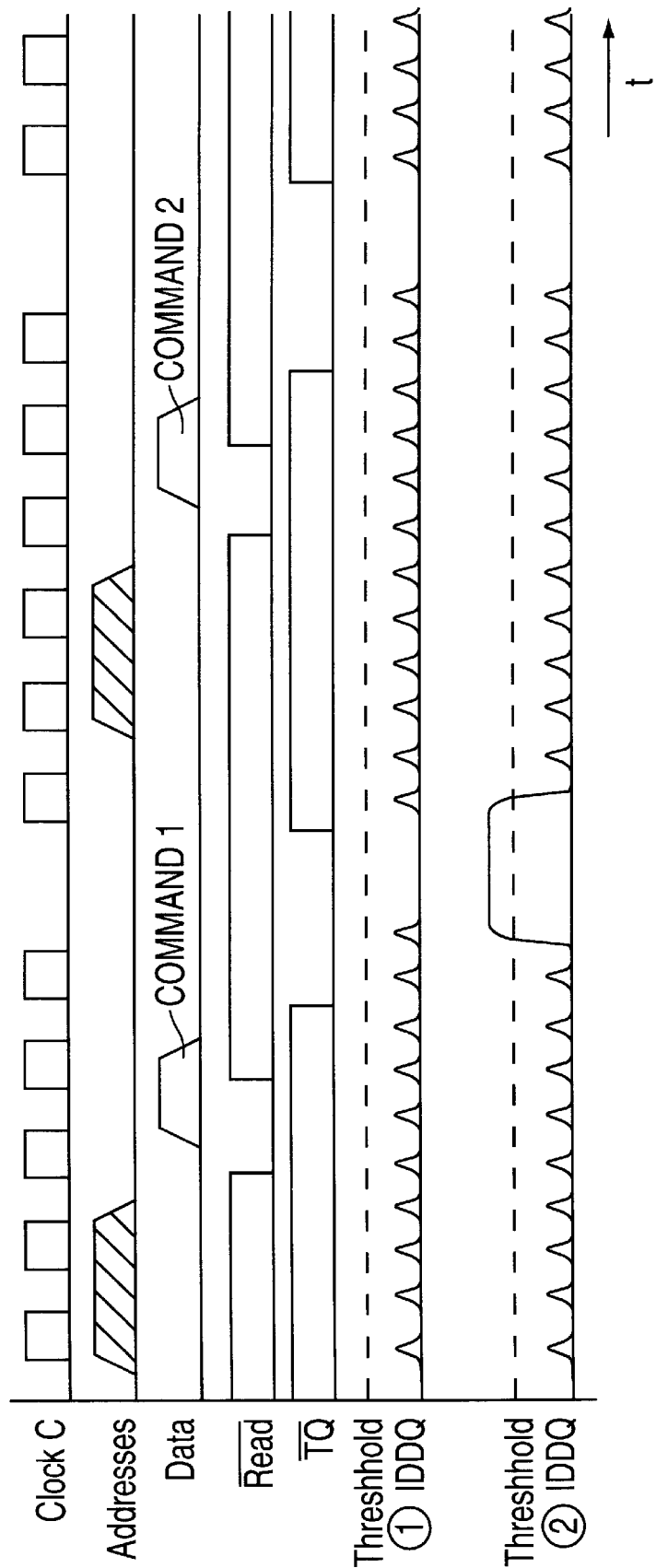
FIG. 4 shows a chronological relationship of various input and output signals.

Chronological signal sequence:

FIG. 4 shows a diagram of the variation of some signals over time. The upper signal train shows clock signal C of clock 13 (FIG. 1). Below that are the address signal, data signal, read signal and TQ signal for activation of the IDDQ test mode. The first curve for the quiescent current IDDQ shows the normal variation of the quiescent current in a processor operating without errors. The quiescent current does not exceed threshold 1 when commands 1 and 2 are executed. The next curve shows that the quiescent current rises above the threshold when there is a certain error during execution of command 1. The processor error can be discovered via command 1, but it is not revealed with command 2, as shown in FIG. 4. Thus a complex spectrum of errors can be detected by a skillful choice of commands (changing the states of the computer internal memories, registers, or circuit nodes).

Alternative quiescent current monitoring:

The circuit arrangements illustrated in FIGS. 2 and 3 have the disadvantage that a measuring resistor R and a switch S are in the circuit of the processor, which can cause interference in many applications, because under some circumstances a voltage drop can then occur in normal operation of the processor at high power supply currents.

Figure 5A:
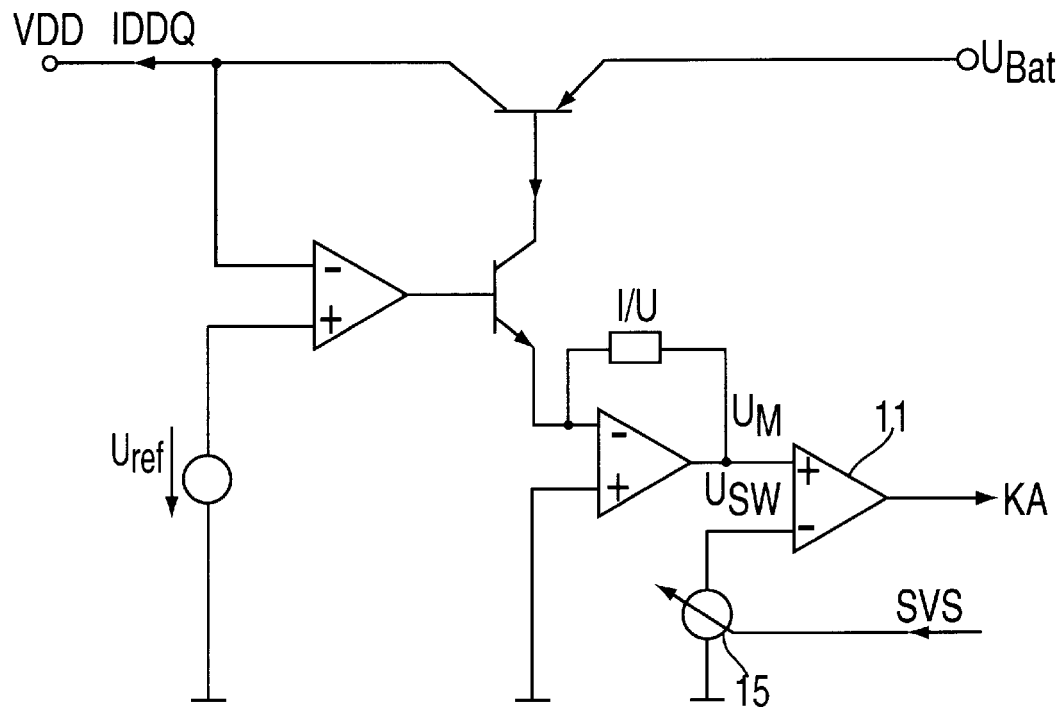
FIG. 5a shows a first variant of a quiescent current measurement.
Figure 5B:
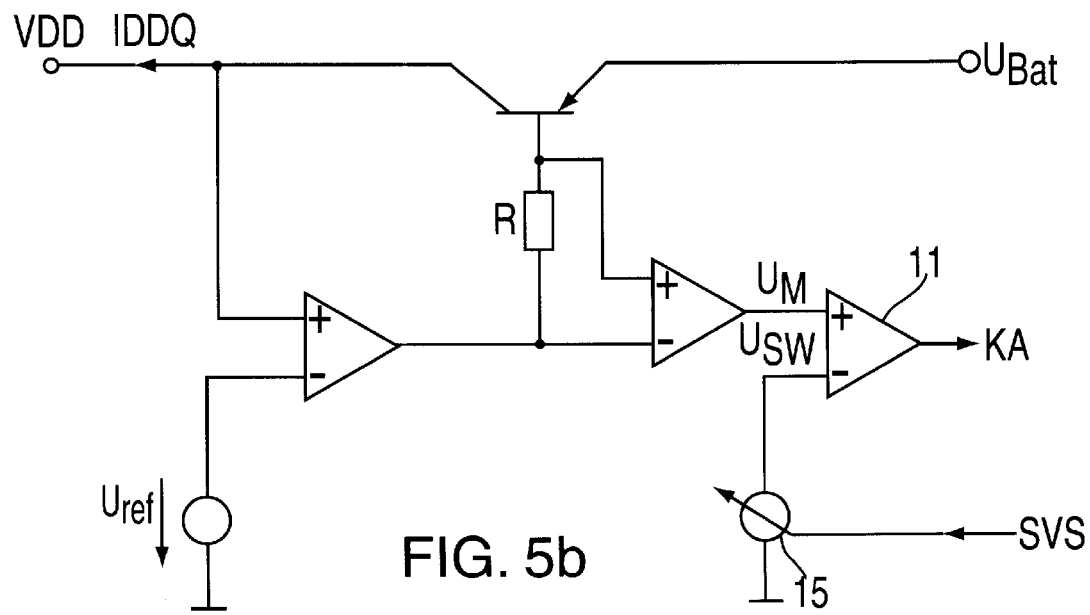
FIG. 5b shows a second variant of the quiescent current measurement.
Figure 5C:
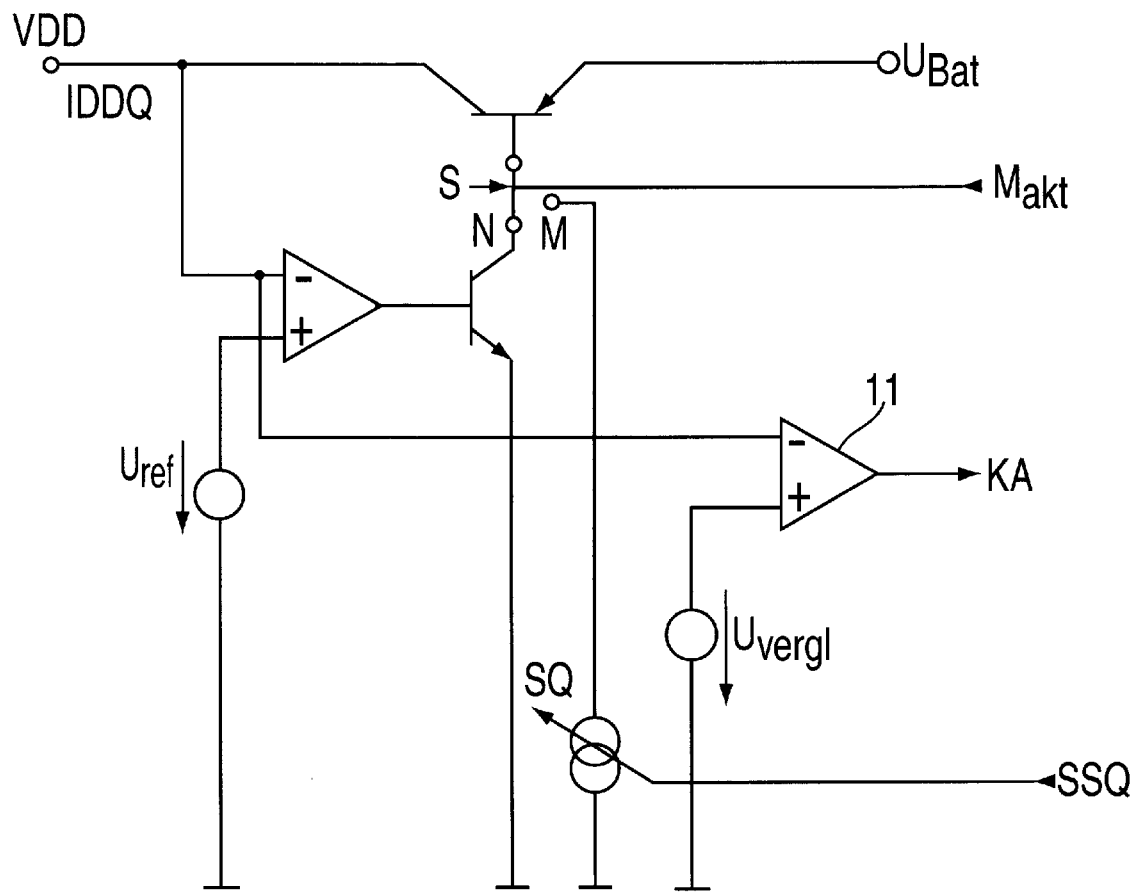
FIG. 5c shows a third variant of the quiescent current measurement.

Therefore, FIG. 5 shows proposed ways to achieve at least one of the objects of the present invention, where the quiescent current monitoring according to this invention is performed in the voltage regulator for the processor. The principle of the circuit arrangements according to FIGS. 5a, 5b and 5c is based on the fact that the internal control current is proportional to the load current, which in the measuring mode corresponds to the quiescent current of the processor. However, a separate power supply is necessary for the processor. The sequence control system is similar to one illustrated in FIGS. 2 and 3, but switching between normal mode and measurement mode can be omitted to some extent in the embodiment illustrated in FIG. 5. The choice of measurement circuits will depend on the given application and the possibility of integration.

FIGS. 5a and 5b show examples of quiescent current measurement in the voltage regulator with a preset voltage and measurement of the current. With the circuit configurations illustrated in FIGS. 5a and 5b, the voltage is regulated at a certain fixed level (e.g., 5 V) and the internal control current is measured. Various methods can be used. FIG. 5a shows a current-voltage conversion, whereas in FIG. 5b the control current is converted to a measuring circuit voltage using a difference amplifier. As an alternative, a current level circuit (not shown) can also be used for conversion.

In FIG. 5c the control current of the voltage regulator is switched to a current source SQ in the measurement mode by setting the switch S from position N to position M. If the quiescent current of the processor is greater than the load current given by SQ, the voltage at the processor drops, which is signaled via the comparator output KA=high if it drops below the comparator voltage $U_{vergl}$.

The procedure described above can be used in principle with any computer in the known CMOS design.

What is claimed is:

1. A system for testing a computer provided within a control unit including a power supply circuit, the system comprising:

a control arrangement switching the computer into at least one predetermined operating mode, the control arrangement provided in the control unit;

a sensor sensing at least one of a current and a voltage in the power supply circuit;

a comparator comparing the at least one of the current and the voltage with at least one predetermined threshold value to generate a comparison value; and an actuator arrangement actuating a particular device as a function of the comparison value.

2. The system according to claim 1, wherein the particular device includes a cut-off unit.

3. The system according to claim 1, wherein the control arrangement includes a measurement sequence control system.

4. The system according to claim 1, wherein the at least one predetermined operating mode includes at least one of an Integrated Circuit Quiescent Current ("IDDQ") mode and a power-down mode.

5. The system according to claim 1, wherein the control arrangement switches predetermined computer sections into a low current mode using a further control unit of the computer.

6. The system according to claim 5, wherein the predetermined computer sections include non-tested sections that are switched into the low current mode.

7. The system according to claim 5, wherein the predetermined computer sections include at least one of an output stage, an analog-to-digital converter, and circuits for an internal clock fan-out, and wherein the predetermined computer sections are powered down for switching into the low current mode.

8. The system according to claim 5, wherein the computer includes a computer core which switches to the low current mode when the predetermined computer sections are switched into the low current mode.

9. The system according to claim 1, further comprising:
a clock unit provided in the control unit, the clock unit being one of turned off, disconnected, and isolated from the computer by a further control unit via the control arrangement.

10. The system according to claim 9, wherein the clock unit is one of powered down and disconnected during at least a portion of a time during which the at least one of the current and the voltage is determined.

11. The system according to claim 1, wherein the computer includes a computer core, wherein the at least one predetermined operating mode is determined by a further control unit of the computer core via the control arrangement, and wherein the comparison value is compared to further predetermined threshold values using the comparator arrangement.

12. the system according to claim 11, wherein the computer includes at least one of memory devices and registers switching into the at least one predetermined operating mode.

13. The system according to claim 1, wherein the current flows through a computer core of the computer, the current being detected directly or via a voltage drop, and wherein the current is detected using at least one of a voltage supply lead, a ground path, and a voltage regulator.

14. The system according to claim 10, wherein the clock unit is powered down at a predetermined time, the predetermined time being determined by linking a synchronization signal of the computer with a clock signal of the computer and by counting the clock signal of the computer.

15. The system according to claim 1, wherein the particular device is disposed externally from the system.

16. The system according to claim 1, wherein the particular device includes a lamp.

17. The system according to claim 1, wherein the sensor senses the current in the power supply circuit, the current being a quiescent current.

18. The system according to claim 1, wherein the control unit is a controller for an anti-lock system.

19. The system according to claim 1, wherein the particular device is an interrupting device which shuts down a system being controlled by the control unit.

* * * * *